(12) United States Patent
Breton et al.

(10) Patent No.: US 7,456,640 B2
(45) Date of Patent: Nov. 25, 2008

(54) STRUCTURE FOR COUPLING PROBES OF PROBE DEVICE TO CORRESPONDING ELECTRICAL CONTACTS ON PRODUCT SUBSTRATE

(75) Inventors: Ronald Richard Breton, Richmond, VT (US); S. Jay Chey, Ossining, NY (US); Steven Alan Cordes, Yorktown Heights, NY (US); Matthew Farinelli, Riverdale, NY (US); Michael David Fregeau, Colchester, VT (US); Sherif Ahmed Goma, White Plains, NY (US); Gene T. Patrick, Richmond, VT (US); Mohammed S. Shaikh, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 11/355,726

(22) Filed: Feb. 16, 2006

(65) Prior Publication Data

US 2007/0200572 A1 Aug. 30, 2007

(51) Int. Cl.
*G01R 31/02* (2006.01)
(52) U.S. Cl. .................... 324/754; 324/761; 324/762
(58) Field of Classification Search ............... None
See application file for complete search history.

(56) References Cited

U.S. PATENT DOCUMENTS

| | | | | |
|---|---|---|---|---|
| 5,534,784 A * | 7/1996 | Lum et al. | ............. | 324/757 |
| 5,828,226 A * | 10/1998 | Higgins et al. | ............. | 324/762 |
| 6,215,321 B1 * | 4/2001 | Nakata | ............. | 324/754 |
| 6,917,102 B2 * | 7/2005 | Zhou et al. | ............. | 257/698 |

* cited by examiner

*Primary Examiner*—Minh N Tang
(74) *Attorney, Agent, or Firm*—F. Chau & Associates, LLC

(57) ABSTRACT

An apparatus for testing integrated circuit devices includes a probe device having a plurality of probes, a first substrate including a product substrate having a first surface and an array of electrical contacts disposed on the first surface thereof, and a second substrate disposed between the probes and the first substrate for electrically coupling the probes to corresponding electrical contacts disposed on the first surface of the product substrate.

20 Claims, 6 Drawing Sheets

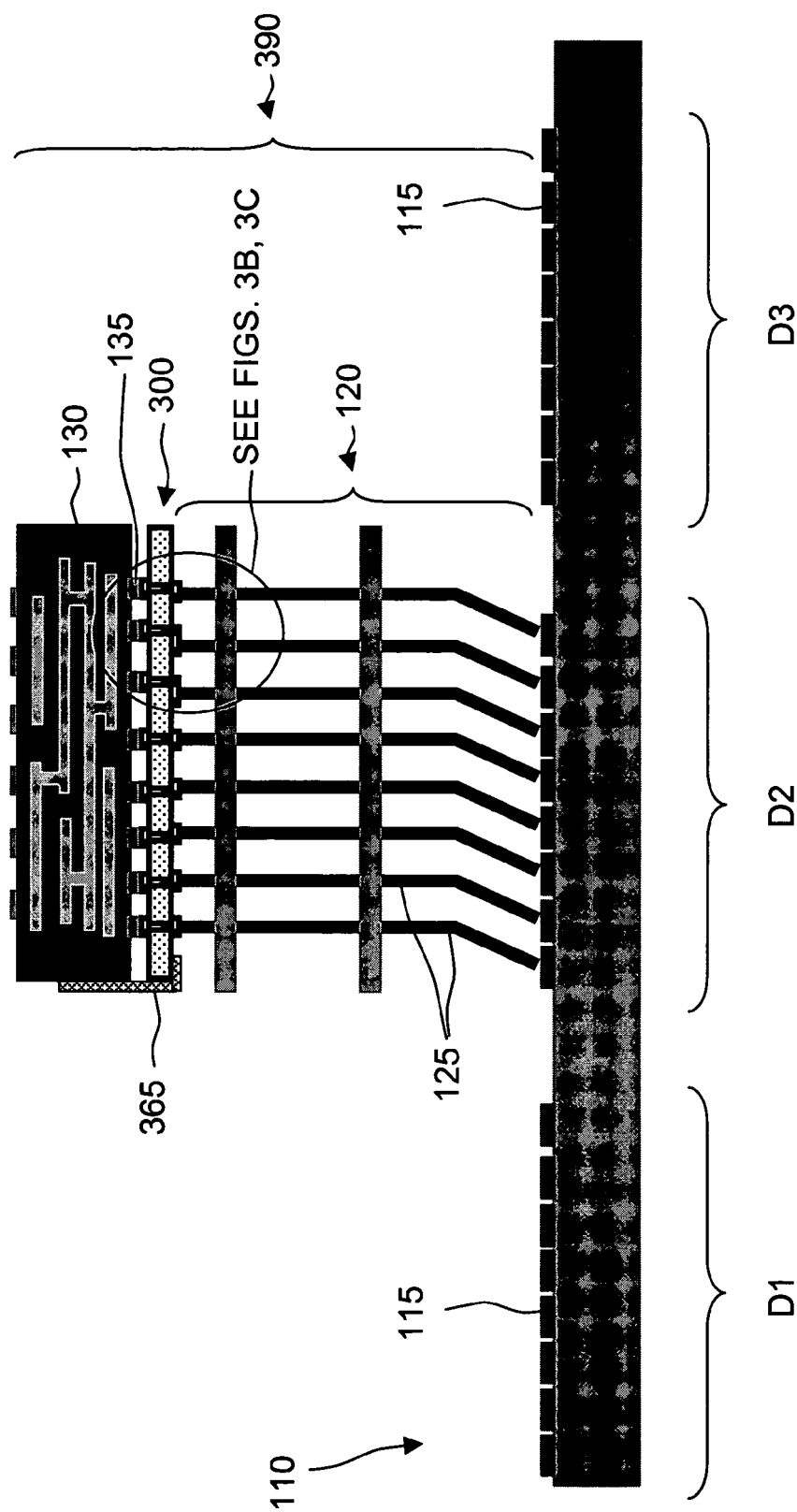

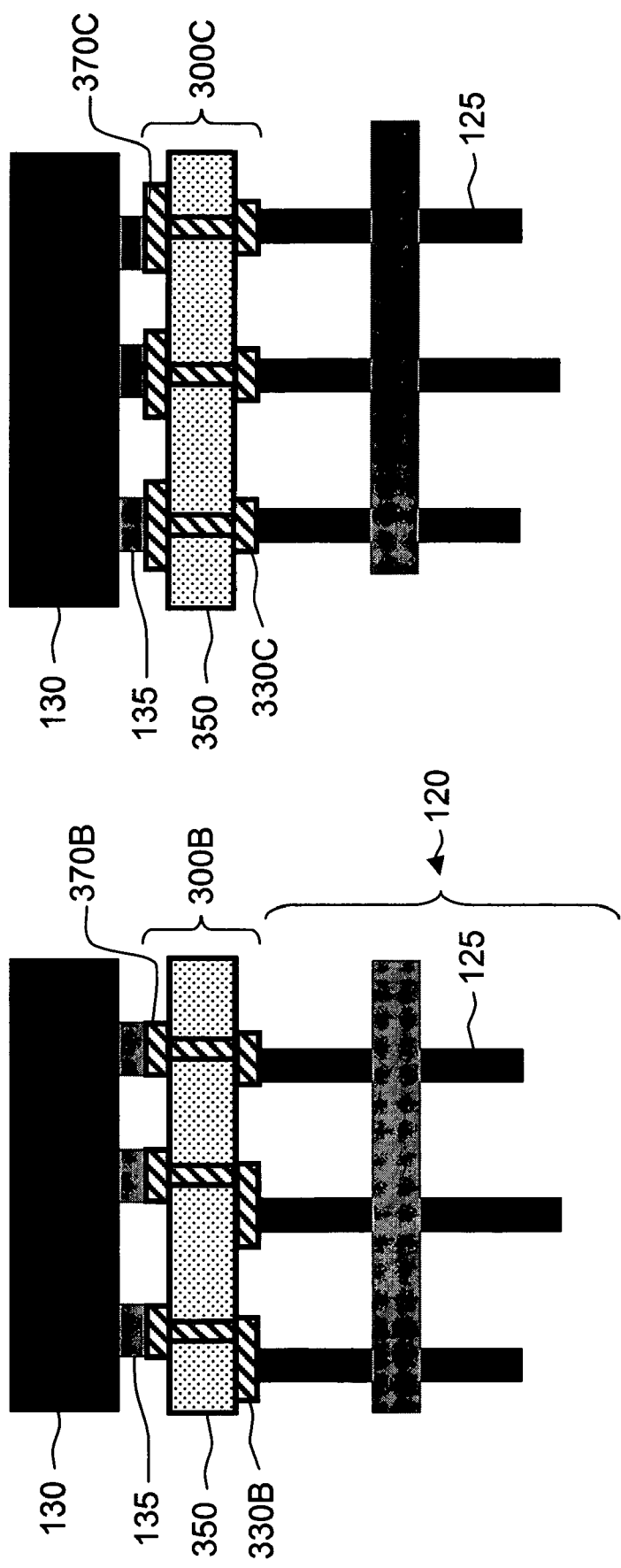

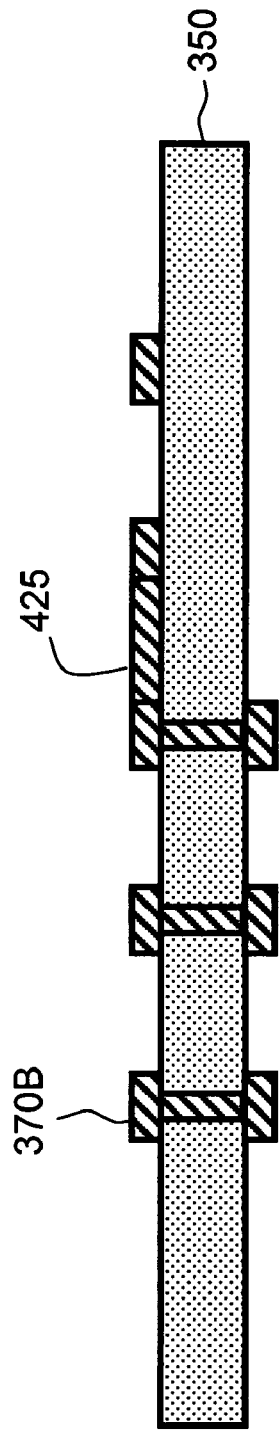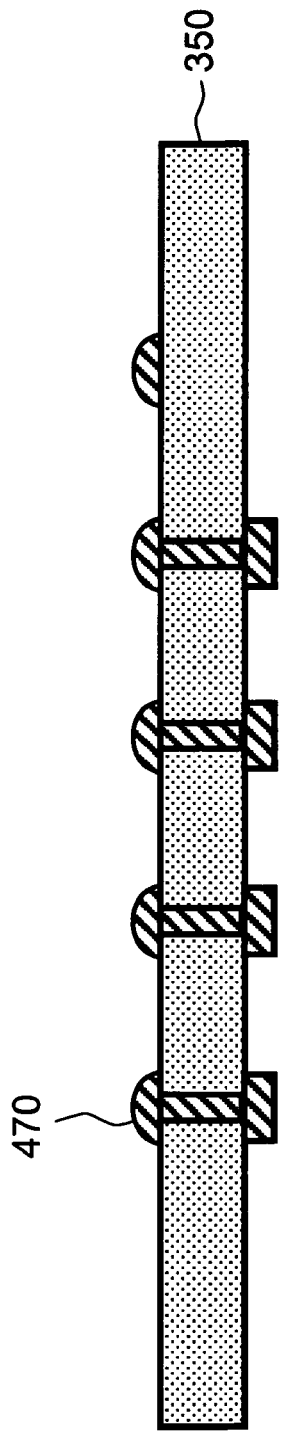

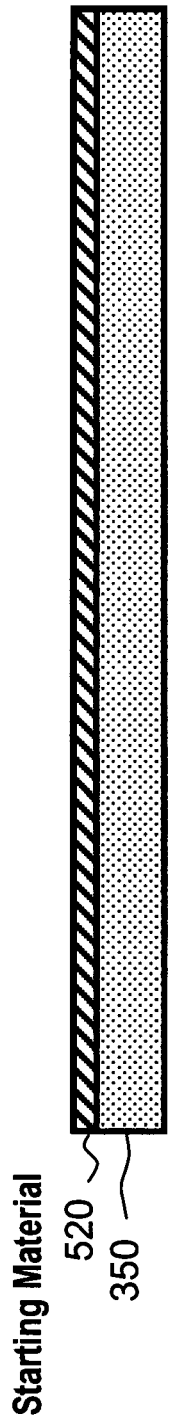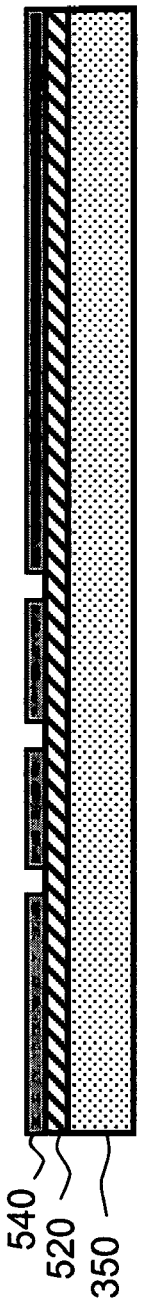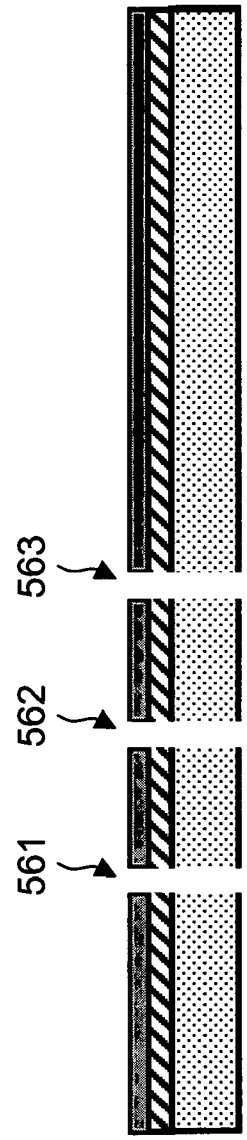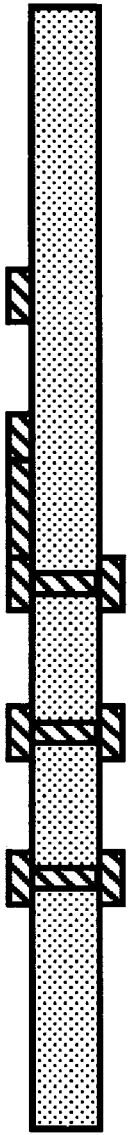
FIG. 5A Starting Material
520
350
FIG. 5B
540
520
350
FIG. 5C
561
562
563
FIG. 5D

STRUCTURE FOR COUPLING PROBES OF PROBE DEVICE TO CORRESPONDING ELECTRICAL CONTACTS ON PRODUCT SUBSTRATE

BACKGROUND OF THE INVENTION

1. Field of the Invention

The present invention relates to a structure useful for testing integrated circuit devices. More particularly, the present invention relates to apparatus and methods for testing integrated circuit devices using a structure for coupling probes of a probe device to corresponding electrical contacts on a product substrate.

2. Description of Related Art

Integrated circuit (IC) devices are normally tested to verify electrical functionality, and certain devices require high-temperature burn-in testing to accelerate early life failures of these devices. Typically, the testing is carried out by contacting connections on the IC devices with one or more testing apparatus. The testing can include testing to assess the functioning of elements of the IC devices as well as the integrity of the structure making up the connections and elements. IC devices are typically tested in wafer form, for example, using a wafer probing system, to separate non-defective chips from defective ones prior to dicing of the wafers into chip areas.

The various types of interconnection methods used to test IC devices include permanent, semi-permanent, and temporary attachment techniques. The permanent and semi-permanent techniques that are typically used include soldering and wire bonding to provide a connection from the IC device to a substrate with fanout wiring or a metal lead frame package. The temporary attachment techniques include rigid and flexible probes that are used to connect the IC device to a substrate with fanout wiring or directly to the test equipment.

Wafer probing is the process of electrically testing each die on a wafer. The probes of a probe device are placed on designated pads on the die, and a tester applies power to the power pads, injects a series of signals into the input pads, and monitors the corresponding signals returned from the output pads. Advanced wafer probing systems are capable of mapping the defective dice on a wafer, including relating the position of the die on the wafer to the failure modes observed.

One conventional type of probe card uses cantilevered arms extending obliquely outwardly from the planar surface of a substrate or a printed circuit board. Another type of probe card uses micro spring probes, eliminating the need for cantilevered arms, but having inherent limitations, such as peripheral probing only and limited pin count due to the size and locations of the springs. Cobra probes are another type of probe card used to test IC devices.

Cobra probes, which are a type of compliant interposer probe, have been used to test IC devices in IBM for many years. Cobra probe cards typically demonstrate performance of up to one million touchdowns. Cobra probes have primarily been used to test IC devices with C4 (Controlled Collapse Chip Connection) solder ball connections, but can be modified to test IC devices with wire bond pads. For example, cobra probes that have been found to be satisfactory for testing IC devices with C4 bumps are disclosed in U.S. Pat. No. 4,027,935 to Byrnes et al., entitled CONTACT FOR AN ELECTRICAL CONTACTOR ASSEMBLY, which is assigned to the common assignee of the present application.

FIG. 1 is a cross-sectional view of a conventional apparatus for testing integrated circuit devices, in an operative position. Referring to FIG. 1, the apparatus 100 includes a probe device 120, a ceramic substrate 130, and a printed circuit board (not shown) coupled to the ceramic substrate 130. During wafer-level testing, the probe device 120 is electrically coupled to the ceramic substrate 130. Wafer probing is typically done on a single chip site. For example, a wafer 110, which is supported by a chuck (not shown), is moved to an operative position such that the tips of the probes 125 make contact with the electrical contacts 115 of a chip D2 of the wafer 110.

The entire probe device 120 or tips of the probes 125 may be made of a high-strength metal such as tungsten to resist damage from use. Even under ideal circumstances, the IC device under test, e.g., chip D2 contact pads, typically receives some damage from the probe tip touchdown.

FIG. 2 is a top view that shows a portion of a conventional ceramic substrate for use in testing integrated circuit devices. Referring to FIG. 2, the ceramic substrate 200, which may be a multi-layer ceramic (MLC), includes an array of electrical contacts disposed on a first surface thereof. For example, the array of electrical contacts includes electrical contacts 212 and 263, which are in design positions on the ceramic substrate 200. During high-temperature processing of ceramic substrates, electrical contacts tend to change position. As a result, the positionally inaccurate electrical contacts, e.g., electrical contacts 220 and 260, are positioned such that at least portions thereof are not aligned to design positions on the ceramic substrate 200. As shown in FIG. 1, certain probes 125 of the probe device 120 are not electrically connected to the electrical contacts 135 of the ceramic substrate 130, e.g., the positionally inaccurate electrical contacts 220 and 260 of FIG. 2. Ceramic substrates for use in testing integrated circuit devices are generally expensive to fabricate and the electrical contacts thereon only last a certain number of testing operations.

SUMMARY OF THE INVENTION

Exemplary embodiments of the present invention generally include apparatus for testing integrated circuit devices, structures for use in testing integrated circuit devices and methods of testing integrated circuit devices.

According to an exemplary embodiment of the present invention, a structure is provided for electrically coupling probes of a probe device to corresponding electrical contacts on a product substrate. The structure comprises: a thin film of electrically insulating material having a plurality of apertures formed therein; an electrically conductive material in the apertures; a first plurality of electrical contacts disposed on a first surface of the thin film of electrically insulating material, wherein the first plurality of electrical contacts are configured to be electrically connectable with the electrical contacts on the product substrate; and a second plurality of electrical contacts disposed on the second surface of the thin film of electrically insulating material, wherein the second plurality of electrical contacts are arranged in a pattern corresponding to the electrical contact footprint of the probe device, wherein the first plurality of electrical contacts on the first surface of the thin film of electrically insulating material are connected to the second plurality of electrical contacts on the second surface of the thin film of electrically insulating material via the electrically conductive material in the apertures.

According to an exemplary embodiment of the present invention, an apparatus for testing integrated circuit devices includes a probe device having a plurality of probes; a first substrate comprising a product substrate having a first surface and an array of electrical contacts disposed on the first surface thereof; and a second substrate disposed between the probes and the first substrate for electrically coupling the probes to corresponding electrical contacts disposed on the first surface of the product substrate.

According to an exemplary embodiment of the present invention, a method is provided for testing integrated circuit devices. The method includes: providing a structure for electrically coupling probes of a probe device to corresponding electrical contacts on a product substrate; using an attachment means, releasably coupling the structure with the product substrate, electrically connecting a first plurality of electrical contacts on a first surface of the structure to corresponding electrical contacts on the product substrate; providing a probe device having a plurality of probes, electrically connecting a second plurality of electrical contacts on a second surface of the structure to the probes of the probe device; and electrically connecting an integrated circuit device to the probes of the probe device.

BRIEF DESCRIPTION OF THE DRAWINGS

The present invention will become more apparent to those of ordinary skill in the art when descriptions of exemplary embodiments thereof are read with reference to the accompanying drawings, of which:

FIG. 3A is a cross-sectional view of an apparatus for testing integrated circuit devices, according to an exemplary embodiment of the invention, in an operative position.

FIG. 3B is an enlarged cross-sectional view of the encircled area 3B of FIG. 3A, according to an exemplary embodiment of the invention.

FIG. 3C is an enlarged cross-sectional view of the encircled area 3B of FIG. 3A, according to another exemplary embodiment of the invention.

FIG. 4A is a cross-sectional view of a structure for use in testing integrated circuit devices, according to an exemplary embodiment of the invention.

FIG. 4B is a cross-sectional view of a structure for use in testing integrated circuit devices, according to another exemplary embodiment of the invention.

FIGS. 5A to 5D illustrate a method of forming a structure for use in testing integrated circuit devices, according to an exemplary embodiment of the invention.

DETAILED DESCRIPTION OF EXEMPLARY EMBODIMENTS

Figure 1:
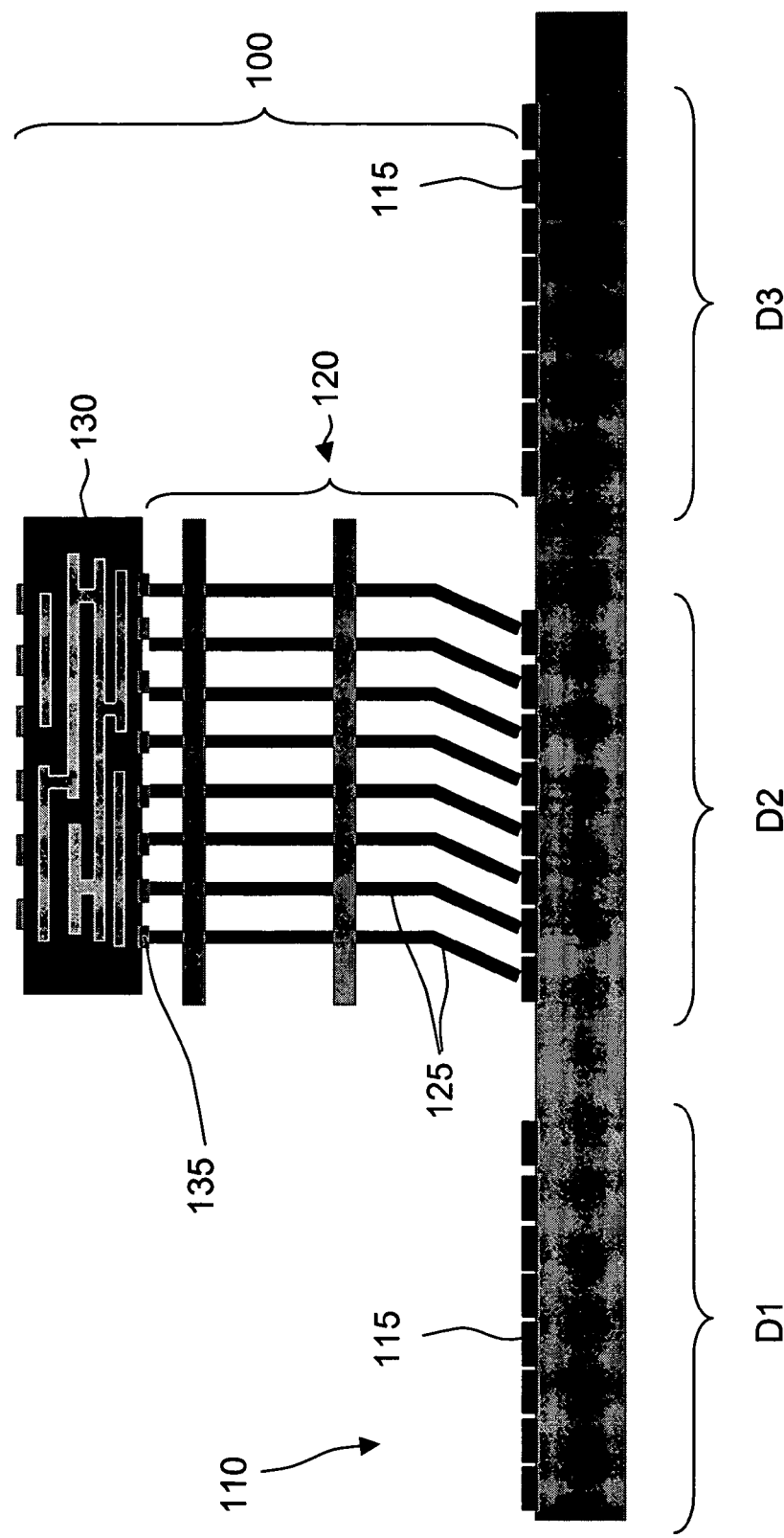
FIG. 1 is a cross-sectional view of a conventional apparatus for testing integrated circuit devices, in an operative position.
Figure 2:
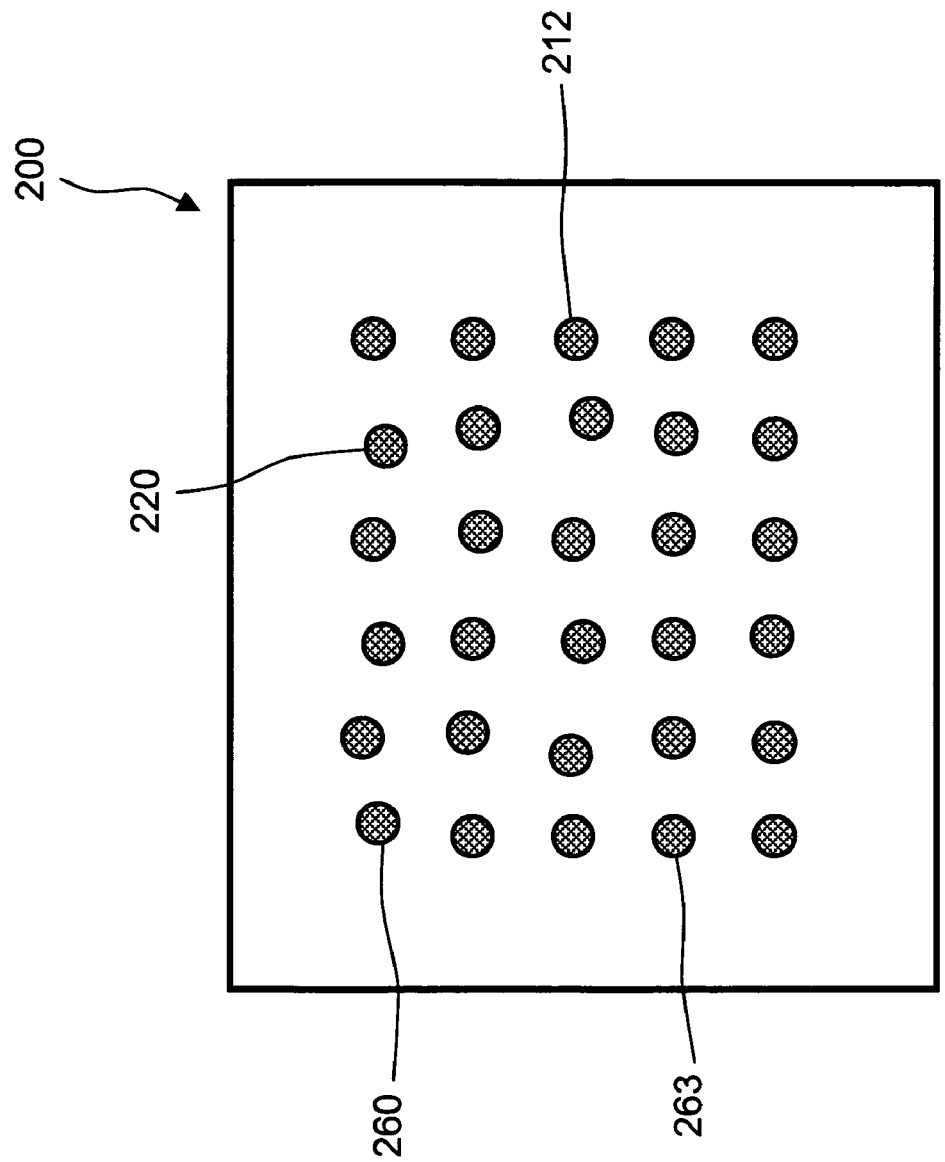
FIG. 2 is a top view that shows a portion of a conventional ceramic substrate for use in testing integrated circuit devices.

Hereinafter, the exemplary embodiments of the present invention will be described with reference to the accompanying drawings. Like reference numerals refer to similar or identical elements throughout the description of the figures. As used herein, the term "electrical contacts" refers to contact pads, pads, bumps, C4 bumps, and the like.

FIG. 3A is a cross-sectional view of an apparatus for testing integrated circuit devices, according to an exemplary embodiment of the invention, in an operative position. The integrated circuit devices may comprise integrated circuit devices in wafer or die form. Referring to FIG. 3A, an apparatus 390 for testing integrated circuit devices includes a probe device 120 having a plurality of probes 125, a first substrate 130, and a second substrate 300.

The probe device 120 may be a vertical probe card, cobra array probe card, cantilever probe card, or micro spring probe card. It is to be understood that any probe device 120 should be suitable for implementing the invention. For example, a probe device 120 capable of probing electrical contacts such as palladium pads, gold alloy pads, copper alloy pads, gold pads, aluminum pads, copper pads, silver pads, nickel pads, gold bumps, or C4 bumps should be suitable for implementing the invention.

In an exemplary embodiment of the present invention, the first substrate 130 comprises a product substrate having a first surface and an array of electrical contacts 135 disposed on the first surface thereof. For example, the product substrate 130 may be a ceramic substrate, glass-ceramic substrate, multi-layer ceramic (MLC), surface laminar circuit (SLC), multi-layer organic (MLO), or wired space transformer. Electrical contacts on product substrates may comprise palladium, an alloy of palladium, palladium cobalt, platinum, gold, an alloy of gold, copper, an alloy of copper, aluminum, rhodium, cobalt, an alloy of cobalt, nickel, an alloy of nickel, cadmium, lead, tin, an alloy of tin, silver, or other electrically conductive material.

In an exemplary embodiment of the present invention, the product substrate 130 is a multi-layer ceramic (MLC) having a first surface and an array of electrical contacts 135 disposed on the first surface thereof, wherein at least one of the electrical contacts 135 has changed position from a first location to a second location on the first surface during high-temperature processing of the product substrate 130, and wherein the first location is a predetermined position corresponding to a design position of the electrical contacts 135 on the product substrate 130.

As shown in FIG. 3A, the second substrate 300 is disposed between the probe device 120 and the product substrate 130 for electrically coupling the probes 125 to corresponding electrical contacts 135 disposed on the first surface of the product substrate 130.

FIG. 3B is an enlarged cross-sectional view of the encircled area of FIG. 3A, according to an exemplary embodiment of the present invention. Referring to FIG. 3B, the second substrate 300B comprises a thin film of electrically insulating material 350 having a plurality of apertures formed therein, wherein the apertures are arranged in a pattern corresponding to an electrical contact footprint of the product substrate 130, and wherein a first plurality of electrical contacts 370B disposed on a first surface of the thin film of electrically insulating material 350 are connected to a second plurality of electrical contacts 330B disposed on a second surface of the thin film of electrically insulating material 350 via an electrically conductive material in the apertures.

FIG. 3C is an enlarged cross-sectional view of the encircled area of FIG. 3A, according to another exemplary embodiment of the present invention. Referring to FIG. 3C, the second substrate 300B comprises a thin film of electrically insulating material 350 having a plurality of apertures formed therein, is wherein the apertures are arranged in a pattern corresponding to an electrical contact footprint of the probe device 120, and wherein a first plurality of electrical contacts 370C disposed on a first surface of the thin film of electrically insulating material 350 are connected to a second plurality of electrical contacts 330C disposed on a second surface of the thin film of electrically insulating material 350 via an electrically conductive material in the apertures. In FIGS. 3B and 3C, the apertures formed in the thin film of electrically insulating material 350 are arranged in exemplary configurations. It is to be understood that various arrangements of the apertures are suitable for implementing the invention.

The first plurality of electrical contacts 370B (or 370C) are configured to be electrically connectable with the electrical contacts 135 on the product substrate 130. In an exemplary embodiment of the present invention, the first plurality of electrical contacts 370B (or 370C) are configured to be electrically connectable with the electrical contacts 135 on the product substrate 130 including the at least a subset of the electrical contacts 135 on the product substrate 130 that are positioned such that at least a portion of the at least a subset of the electrical contacts 135 are not aligned to the design position thereof. For example, the first plurality of electrical contacts 370B (or 370C) may be of a predetermined size and/or predetermined shape such that electrical contacts 370B (or 370C) are electrically connectable with the electrical contacts 135 on the product substrate 130 including the at least a subset of the electrical contacts 135 on the product substrate 130 that are positioned such that at least a portion of the at least a subset of the electrical contacts 135 are not aligned to the design position thereof. It is not necessary for the first plurality of electrical contacts 370B (or 370C) to be the same size or shape.

The second plurality of electrical contacts 330B (or 330C) are arranged in a pattern corresponding to the electrical contact footprint of the probe device. It will be understood that the first plurality of electrical contacts 370B (or 370C) and the second plurality of electrical contacts 330B (or 330C) comprise an electrically conductive material. Any electrically conducting materials may be utilized. For example, the electrically conducting material could be a metal.

As shown in FIG. 3A, the apparatus 390 may include an attachment means 365 for releasably coupling the first substrate 130 with the second substrate 300. The attachment means will be described later in this disclosure.

Hereinafter, a structure for electrically coupling probes of a probe device to corresponding electrical contacts on a product substrate, wherein at least a subset of the electrical contacts on the product substrate are positioned such that at least a portion of the at least a subset of the electrical contacts are not aligned to a design position thereof, will be described with reference to FIGS. 3A, 3B, 3C, 4A and 4B. FIG. 4A is a cross-sectional view of a structure for use in testing integrated circuit devices, according to an exemplary embodiment of the invention. FIG. 4B is a cross-sectional view of a structure for use in testing integrated circuit devices, according to another exemplary embodiment of the invention.

Referring to FIG. 3A and FIG. 4A, a structure for electrically coupling probes 125 of a probe device 120 to corresponding electrical contacts on a product substrate 130 comprises a thin film of electrically insulating material 350 having a plurality of apertures formed therein. It is to be understood that the thin film of electrically insulating material 350 may be embodied having various thickness. For example, the thickness of the thin film of electrically conducting material 350 may be about 1 mil to about 3 mils. The thickness of the thin film of electrically insulating material 350 may be about 1 mil to about 4 mils. Although not shown as such in FIGS. 3A, 3B, 3C, 4A and 4B, the cross-sectional area of apertures may be larger than the cross-sectional areas of the electrical contacts. Referring to FIGS. 3B and 3C, the apertures are arranged in a pattern corresponding to an electrical contact footprint of the probe device 120 and/or the product substrate 130.

A first plurality of electrical contacts 370B, as shown in FIGS. 3B and 4A, are disposed on a first surface of the thin film of electrically insulating material 350. It is to be understood that electrical contacts on the first surface of the thin film of electrically insulating material 350 may be embodied in various shapes and/or sizes. For example, the bump-shaped electrical contacts 470 of FIG. 4B should be suitable for implementing the invention. In an exemplary embodiment of the present invention, the first plurality of electrical contacts 370 are configured to be electrically connectable with the electrical contacts 135 on the product substrate 130 including the at least a subset of the electrical contacts 135 on the product substrate 130 that are positioned such that at least a portion of the at least a subset of the electrical contacts 135 are not aligned to the design position 15 thereof. As shown in FIGS. 4A and 4B, it is not necessary that an aperture be provided at every location where an electrical contact exists. A layer 425 of electrically conducting material may be provided to electrically connect selected electrical contacts, as shown in FIG. 4A.

A second plurality of electrical contacts 330 are disposed on the second surface of the thin film of electrically insulating material 350. The second plurality of electrical contacts 330 may be arranged in a pattern corresponding to the electrical contact footprint of the probe device 120. It is to be understood that electrical contacts on the second surface of the thin film of electrically insulating material 350 may be embodied in various shapes and/or sizes.

The first plurality of electrical contacts on the first surface of the thin film of electrically insulating material 350 are connected to the second plurality of electrical contacts on the second surface of the thin film of electrically insulating material 350 via the electrically conductive material in the apertures.

FIGS. 5A to 5D illustrate a method of forming a structure for use in testing integrated circuit devices, according to an exemplary embodiment of the invention. Hereinafter a method of constructing the structure for electrically coupling probes of a probe device to corresponding electrical contacts on a product substrate, in accordance with an exemplary embodiment of the present invention, will be described with reference to FIGS. 5A to 5D.

The method includes providing a thin film of electrically insulating material 350 having a first surface and a second surface. Any thin film of electrically insulating material(s) may be utilized. For example, the thin film of electrically insulating material 350 may comprise Acrylonitrile butadiene styrene (ABS), Acrylic, Celluloid, Cellulose acetate, Ethylene vinyl alcohol (ENAL), Fluoroplastics (PTFEs, including FEP, PFA, CTFE, ECTFE, ETFE), Ionomers, Liquid Crystal Polymer (LCP), Polyacetal (POM or Acetal), Polyacrylates (Acrylic), Polyacrylonitrile (PAN or Acrylonitrile), Polyamide (PA or Nylon), Polyamide-imide (PAI), Polyaryletherketone (PAEK or Ketone), Polybutadiene (PBD), Polybutylene (PB), Polybutylene teraphthalate (PBT), Polyethylene terephthalate (PET), Polycyclohexylene di-methylene terephthalate (PCT), Polycarbonate (PC), Polyketone (PK), Polyester, Polyethylene/Polythene/Polyethene, Polyetherether-ketone (PEEK), Polyether-imide (PEI), Polyethersulfone (PES), Polyethylene-chlorinates (PEC), Polyimide (PI), Polymethylpentene (PMP), Polyphenylene oxide (PPO), Polyphenylene sulfide (PPS), Polyphthalamide (PPA), Polypropylene (PP), Polystyrene (PS), Polysulfone (PSU), Polyvinyl chloride (PVC), Kapton, Teflon, thermoplastic material, fiberglass, or combinations thereof. As shown in FIG. 5A, the thin film of electrically insulating material 350 may be supplied with an electrically conducting material 520 attached thereto. For example, the electrically insulating material 350 may be Kapton and the electrically conducting material 520 may be copper.

A plurality of apertures, such as apertures 561, 562 and 563, are formed in the thin film of electrically insulating material 350. Although not shown as such in FIG. 5C, the cross-sectional area of apertures may vary. Any suitable technique may be utilized to form the apertures. According to an exemplary embodiment of the present invention, the apertures are formed by laser ablation of the thin film of electrically insulating material 350 through a moly mask 540, as shown in FIGS. 5B and 5C. Although not shown as such in FIG. 5C, the cross-sectional area of the apertures 561, 562 and 563 may vary. Drilling, punching, or standard photolithographic techniques could also be utilized to form the apertures. Referring to FIGS. 3B and 3C, the apertures are arranged in a pattern corresponding to an electrical contact footprint of the probe device 120 and/or the product substrate 130. It is not necessary that an aperture be produced at every location where an electrical contact exists.

An electrically conductive material is deposited in the apertures. Any electrically conducting materials may be utilized. For example, electrically conductive materials that are suitable for implementing the invention include, but are not limited to, palladium, an alloy of palladium, palladium cobalt, platinum, gold, an alloy of gold, copper, an alloy of copper, aluminum, rhodium, cobalt, an alloy of cobalt, nickel, an alloy of nickel, cadmium, lead, tin, an alloy of tin, silver, and combinations thereof. The electrically conducting material could be deposited utilizing any suitable techniques. According to an exemplary embodiment of the present invention, electrodepositing is utilized. Examples of methods of forming thin film structures, which may be useful in constructing the structures of the present invention, are disclosed in U.S. Pat. No. 6,731,128 to Das et al., entitled TFI PROBE I/O WRAP TEST METHOD, which is assigned to the common assignee of the present application.

A first plurality of electrical contacts 370 are formed on the first surface of the thin film of electrically insulating material 350. The first plurality of electrical contacts 370 may be formed using standard deposition, photolithographic, and etching techniques widely known and used in semiconductor processing. In an exemplary embodiment of the present invention, at least one layer of an electrically conductive material is supplied attached to the thin film of electrically insulating material 350, e.g., copper on Kapton, and the step of patterning the conductive layer to form one or more electrical contacts 370 or 330, can be accomplished using standard photolithographic processes. This step involves deposition of photoresist, e.g., electro-deposition (ED) of photoresist, and etching of the conductive layer using any standard technique having a suitable selectivity to the thin film of electrically insulating material.

In an exemplary embodiment of the present invention, the first plurality of electrical contacts 370 are configured to be electrically connectable with the electrical contacts 135 on the product substrate 130 including the at least a subset of the electrical contacts 135 on the product substrate 130 that are positioned such that at least a portion of the at least a subset of the electrical contacts 135 are not aligned to the design position thereof.

A second plurality of electrical contacts 330 are formed on the second surface of the thin film of electrically insulating material 350. The second plurality of electrical contacts 330 may be arranged in a pattern corresponding to the electrical contact footprint of the probe device 120.

As shown in FIG. 5D, the first plurality of electrical contacts on the first surface of the thin film of electrically insulating material 350 are connected to the second plurality of electrical contacts on the second surface of the thin film of electrically insulating material 350 via the electrically conductive material in the apertures.

Hereinafter, a method of testing integrated circuit devices using a structure for electrically coupling probes of a probe device to corresponding electrical contacts on a product substrate, wherein at least a subset of the electrical contacts on the product substrate are positioned such that at least a portion of the at least a subset of the electrical contacts are not aligned to a design position thereof, will be described.

A method of testing integrated circuit devices, according to an exemplary embodiment of the present invention, includes the step of providing a structure for electrically coupling probes of a probe device to corresponding electrical contacts on a product substrate.

In an exemplary embodiment of the present invention, the structure for electrically coupling probes of a probe device to corresponding electrical contacts on a product substrate comprises a thin film of electrically insulating material having a plurality of apertures formed therein, wherein a first plurality of electrical contacts disposed on a first surface of the thin film of electrically insulating material are connected to a second plurality of electrical contacts disposed on a second surface of the thin film of electrically insulating material via an electrically conductive material in the apertures. The apertures may be arranged in a pattern corresponding to an electrical contact footprint of at least one of the probe device or the product substrate. In an exemplary embodiment of the present invention, the first plurality of electrical contacts are configured to be electrically connectable with the electrical contacts on the product substrate including the at least a subset of the electrical contacts on the product substrate that are positioned such that at least a portion of the at least a subset of the electrical contacts are not aligned to the design position thereof. The second plurality of electrical contacts may be arranged in a pattern corresponding to an electrical contact footprint of the probe device.

An attachment means is used to releasably couple the structure with the product substrate, electrically connecting the electrical contacts on the first surface of the structure to corresponding electrical contacts on the product substrate. The attachment means may comprise an adhesive layer that is affixed to the first and/or second surface of the thin film of electrically insulating material and to a surface of the product substrate. It will be understood that the adhesive layer may comprise an adhesive tape. Preferably, the electrically adhesive layer comprises a releasable adhesive. For example, the attachment means may comprise a releasable adhesive tape 365, as shown in FIG. 3A, which is affixed to a region on the thin film of electrically insulating material and to a region on the product substrate. Although not shown as such in FIG. 3A, a plurality of strips of the releasable adhesive tape 365 may be affixed to a plurality regions on the thin film of electrically insulating material and the product substrate.

In an exemplary embodiment of the present invention, the attachment means comprises a releasable fastener such as a clip. In an exemplary embodiment of the present invention, the attachment means comprises an electrically conductive releasable adhesive layer disposed on one or more of the electrical contacts on the first surface of the thin film of electrically insulating material and/or on one or more of the electrical contacts on the product substrate. It is to be understood that any attachment means for releasably coupling the structure with the product substrate, such that the electrical contacts on the first surface of the thin film of electrically insulating material are electrically coupled with the electrical contacts on the product substrate, should be suitable for implementing the invention.

The electrical contacts on the thin film of electrically insulating material only last a certain number of testing operations due to the wear and tear of the probe tips. However, since the structure for electrically coupling probes of a probe device to corresponding electrical contacts on a product substrate is releasably coupled with the product substrate, according to exemplary embodiments of the present invention, the structure can be removed and replaced as necessary.

A probe device having a plurality of probes is provided, electrically connecting a second plurality of electrical contacts on a second surface of the structure to the probes of the probe device. An integrated circuit device is electrically connected to the probes of the probe device.

According to exemplary embodiments of the present invention, wear on the electrical contacts of the product substrate may be reduced, and the service lifetime of the product substrate may be extended. According to exemplary embodiments of the present invention, time required for testing integrated circuit devices may be reduced, since the need to repair or replace a product substrate may be minimized.

Although exemplary embodiments of the present invention have been described in detail with reference to the accompanying drawings for the purpose of illustration and description, it is to be understood that the inventive processes and apparatus are not to be construed as limited thereby. It will be readily apparent to those of reasonable skill in the art that various modifications to the foregoing exemplary embodiments may be made without departing from the scope of the invention as defined by the appended claims, with equivalents of the claims to be included therein.

What is claimed is:

1. A structure for electrically coupling probes of a probe device to corresponding electrical contacts on a product substrate, the structure comprising:
   a thin film of electrically insulating material having a plurality of apertures formed therein, wherein the thin film of electrically insulating material is releasably coupled with the product substrate;
   an electrically conductive material in the apertures;
   a first plurality of electrical contacts disposed on a first surface of the thin film of electrically insulating material, wherein the first plurality of electrical contacts are configured to be electrically connectable with the electrical contacts on the product substrate; and
   a second plurality of electrical contacts disposed on the second surface of the thin film of electrically insulating material, wherein the second plurality of electrical contacts are arranged in a pattern corresponding to the electrical contact footprint of the probe device,
   wherein the first plurality of electrical contacts on the first surface of the thin film of electrically insulating material are connected to the second plurality of electrical contacts on the second surface of the thin film of electrically insulating material via the electrically conductive material in the apertures, and
   the apertures include a first aperture and a second aperture, the first aperture including a first end on the first surface and a second end on the second surface and the second aperture including a first end on the first surface and a second end on the second surface, a distance between the first end of the first aperture and the first end of the second aperture is substantially the same as a distance between the second end of the first aperture and the second end of the second aperture.

2. The structure of claim 1, wherein at least a subset of the electrical contacts on the product substrate are positioned such that at least a portion of the at least a subset of the electrical contacts are not aligned to a design position thereof, and wherein the first plurality of electrical contacts are formed to be electrically connectable with the electrical contacts on the product substrate including the at least a subset of the electrical contacts on the product substrate that are positioned such that at least a portion of the at least a subset of the electrical contacts are not aligned to the design position thereof.

3. The structure of claim 1, wherein the apertures are arranged in a pattern corresponding to an electrical contact footprint of at least one of the probe device or the product substrate.

4. The structure of claim 1, wherein the thin film of electrically insulating material is provided with at least one layer of an electrically conductive material on at least one of the first surface or the second surface thereof.

5. An apparatus for testing integrated circuit devices, comprising:
   a probe device having a plurality of probes;
   a product substrate having a first surface and an array of electrical contacts disposed on the first surface thereof; and
   a substrate releasably coupled between the probes and the product substrate for electrically coupling the probes to corresponding electrical contacts disposed on the first surface of the product substrates,
   wherein the substrate includes a thin film of electrically insulating material having a plurality of apertures formed therein, and the apertures include a first aperture and a second aperture, the first aperture including a first end on the first surface and a second end on the second surface and the second aperture including a first end on the first surface and a second end on the second surface, a distance between the first end of the first aperture and the first end of the second aperture is substantially the same as a distance between the second end of the first aperture and the second end of the second aperture.

6. The apparatus of claim 5, wherein the probe device is a vertical probe card, cobra array probe card, cantilever probe card, or micro spring probe card.

7. The apparatus of claim 5, wherein the product substrate is a ceramic substrate, glass-ceramic substrate, multi-layer ceramic (MLC), surface laminar circuit (SLC), multi-layer organic (MLO), or wired space transformer.

8. The apparatus of claim 5, wherein a first plurality of electrical contacts disposed on a first surface of the thin film of electrically insulating material are connected to a second plurality of electrical contacts disposed on a second surface of the thin film of electrically insulating material via an electrically conductive material in the apertures.

9. The apparatus of claim 8, wherein the apertures are arranged in a pattern corresponding to an electrical contact footprint of at least one of the probe device or the product substrate.

10. The apparatus of claim 8, wherein the first plurality of electrical contacts are formed to be electrically connectable with the electrical contacts on the product substrate.

11. The apparatus of claim 10, wherein the first plurality of electrical contacts are formed to at least one of a predetermined size or a predetermined shape to be electrically connectable with the electrical contacts on the product substrate.

12. The apparatus of claim 8, wherein the first plurality of electrical contacts are formed to be electrically connectable with the electrical contacts on the product substrate including at least a subset of the electrical contacts on the product substrate that are positioned such that at least a portion of the at least a subset of the electrical contacts are not aligned to the design position thereof.

13. The apparatus of claim 8, wherein the second plurality of electrical contacts are arranged in a pattern corresponding to the electrical contact footprint of the probe device.

14. The apparatus of claim 5, further comprising an attachment means, releasably coupling the product substrate with the substrate such that the array of electrical contacts disposed on the first surface of the product substrate are electrically coupled with corresponding electrical contacts disposed on a first surface of the substrate.

15. The apparatus of claim 14, wherein the attachment means comprises at least one of a releasable adhesive tape, a releasable adhesive, a releasable clip, or a releasable fastener.

16. A method of testing integrated circuit devices, comprising:
   providing a structure for electrically coupling probes of a probe device to corresponding electrical contacts on a product substrate;
   using at least one of a fastener or an adhesive layer, releasably coupling the structure with the product substrate, electrically connecting a first plurality of electrical contacts on a first surface of the structure to corresponding electrical contacts on the product substrate;
   providing the probe device having the plurality of probes, electrically connecting a second plurality of electrical contacts on a second surface of the structure to the probes of the probe device; and
   electrically connecting an integrated circuit device to the probes of the probe device,
   wherein the structure comprises a thin film of electrically insulating material having a plurality of parallel apertures formed therein connecting the first and second plurality of electrical contacts.

17. The method of claim 16, wherein the first plurality of electrical contacts are configured to be electrically connectable with the electrical contacts on the product substrate including at least a subset of the electrical contacts on the product substrate that are positioned such that at least a portion of the at least a subset of the electrical contacts are not aligned to the design position thereof.

18. The method of claim 16, wherein the second plurality of electrical contacts are arranged in a pattern corresponding to an electrical contact footprint of the probe device.

19. The method of claim 16, wherein the attachment means comprises at least one of a releasable adhesive tape, a releasable adhesive, a releasable clip, or a releasable fastener.

20. The structure of claim 1, wherein a number of the electrical contacts disposed on the second surface of the thin film of electrically insulating material are arranged asymmetrically with respect to the apertures.

* * * * *